United States Patent
Chiang et al.

(10) Patent No.: US 9,842,761 B2
(45) Date of Patent: Dec. 12, 2017

(54) MECHANISMS FOR FORMING FINFETS WITH DIFFERENT FIN HEIGHTS

(71) Applicant: TAIWAN SEMICONDUCTOR MANUFACTURING CO., LTD., Hsinchu (TW)

(72) Inventors: Tsung-Yu Chiang, New Taipei (TW); Chung-Wei Lin, Toufen Township (TW); Kuang-Hsin Chen, Jung-Li (TW); Bor-Zen Tien, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/418,269

(22) Filed: Jan. 27, 2017

(65) Prior Publication Data

US 2017/0140980 A1    May 18, 2017

Related U.S. Application Data

(60) Continuation of application No. 14/919,007, filed on Oct. 21, 2015, now Pat. No. 9,559,011, which is a
(Continued)

(51) Int. Cl.
*H01L 21/82* (2006.01)
*H01L 21/762* (2006.01)
(Continued)

(52) U.S. Cl.
CPC ...... *H01L 21/76237* (2013.01); *H01L 21/266* (2013.01); *H01L 21/2636* (2013.01);
(Continued)

(58) Field of Classification Search
CPC ............. H01L 21/82; H01L 21/823481; H01L 21/8631; H01L 21/31111
See application file for complete search history.

(56) References Cited

U.S. PATENT DOCUMENTS

| | | | |
|---|---|---|---|
| 8,106,459 B2 | 1/2012 | Chang et al. | |
| 8,361,894 B1 * | 1/2013 | Hargrove | H01L 21/845 257/E21.4 |

(Continued)

FOREIGN PATENT DOCUMENTS

| | | |
|---|---|---|
| CN | 102074582 A | 5/2011 |
| KR | 10-0150674 B1 | 10/1998 |
| KR | 10-2011-0056225 A | 5/2011 |

OTHER PUBLICATIONS

"Electrochemistry-Surface reaction, structure and micromachining of silicon and silicon oxide," Sep. 30, 2004, pp. 128-133 (7 pages total), with an English abstract.

*Primary Examiner* — Phuc Dang
(74) *Attorney, Agent, or Firm* — Birch, Stewart, Kolasch & Birch, LLP

(57) ABSTRACT

A semiconductor device is provided. The semiconductor device includes a first fin partially surrounded by a first isolation structure and a second fin partially surrounded by a second isolation structure. The second isolation structure has a dopant concentration higher than that of the first isolation structure, and a height difference is between a top surface of the first isolation structure and a top surface of the second isolation structure.

20 Claims, 12 Drawing Sheets

Related U.S. Application Data division of application No. 14/142,527, filed on Dec. 27, 2013, now Pat. No. 9,184,087.

(51) Int. Cl.

| | | |
|---|---|---|
| *H01L 21/263* | (2006.01) | |
| *H01L 21/266* | (2006.01) | |
| *H01L 27/088* | (2006.01) | |
| *H01L 29/06* | (2006.01) | |
| *H01L 29/78* | (2006.01) | |
| *H01L 21/8234* | (2006.01) | |
| *H01L 21/84* | (2006.01) | |
| *H01L 29/66* | (2006.01) | |
| *H01L 27/12* | (2006.01) | |
| *H01L 21/3115* | (2006.01) | |
| *H01L 21/311* | (2006.01) | |

(52) U.S. Cl.
CPC ... *H01L 21/31111* (2013.01); *H01L 21/31116* (2013.01); *H01L 21/31155* (2013.01); *H01L 21/76224* (2013.01); *H01L 21/823431* (2013.01); *H01L 21/823481* (2013.01); *H01L 21/845* (2013.01); *H01L 27/0886* (2013.01); *H01L 27/1211* (2013.01); *H01L 29/0649* (2013.01); *H01L 29/0653* (2013.01); *H01L 29/66795* (2013.01); *H01L 29/785* (2013.01)

(56) References Cited

U.S. PATENT DOCUMENTS

| | | | |
|---|---|---|---|
| 8,569,159 B2 | 10/2013 | Cheng | |
| 8,674,449 B2 * | 3/2014 | Zhu | H01L 29/66795 257/368 |
| 2007/0134864 A1 | 6/2007 | Anderson et al. | |
| 2007/0170474 A1 | 7/2007 | Kawasaki | |
| 2011/0121406 A1 * | 5/2011 | Lee | H01L 21/823431 257/401 |
| 2011/0254119 A1 | 10/2011 | Seo | |
| 2012/0032267 A1 * | 2/2012 | Cheng | H01L 21/31111 257/368 |
| 2012/0299115 A1 | 11/2012 | Chuang et al. | |
| 2013/0056826 A1 | 3/2013 | Liu et al. | |
| 2013/0062699 A1 | 3/2013 | Zhu et al. | |
| 2013/0126972 A1 | 5/2013 | Wang | |
| 2014/0239347 A1 | 8/2014 | van Dal | |
| 2014/0306317 A1 * | 10/2014 | Licausi | H01L 21/30625 257/506 |
| 2015/0118832 A1 | 4/2015 | Wood | |
| 2015/0162436 A1 | 6/2015 | Toh | |

\* cited by examiner

MECHANISMS FOR FORMING FINFETS WITH DIFFERENT FIN HEIGHTS

CROSS REFERENCE TO RELATED APPLICATIONS

This application is a Continuation application of U.S. patent application Ser. No. 14/919,007, filed on Oct. 21, 2015 (now U.S. Pat. No. 9,559,011 issued on Jan. 31, 2017), which is a Divisional application of U.S. patent application Ser. No. 14/142,527, filed on Dec. 27, 2013 (now U.S. Pat. No. 9,184,087 issued on Nov. 10, 2015), the entire contents of which are incorporated by reference.

BACKGROUND

The semiconductor industry has been experiencing rapid growth due to continuous improvements in the integration density of various electronic components (e.g., transistors, diodes, resistors, capacitors, etc.). For the most part, this improvement in integration density has come from repeated reductions in minimum feature sizes, which allows more components to be integrated into a given area. However, smaller feature size may lead to more leakage current. As the demand for even smaller electronic devices has grown recently, there is a need for reducing leakage current in semiconductor devices.

The so called Fin field effect transistor (FinFET) device is becoming increasing popular. The FinFET device is fabricated with a thin fin-like structure called a "fin", extending from a substrate, and a gate provided over (e.g., wrapping around) the fin. The fin structure is made of semiconductor material, typically silicon, and if used as a transistor, has a current channel formed inside. Because the gate wraps around the channel region on three sides, FinFETs provide excellent channel control with small critical dimensions.

BRIEF DESCRIPTION OF THE DRAWINGS

For a more complete understanding of the present disclosure, and the advantages thereof, reference is now made to the following descriptions taken in conjunction with the accompanying drawings, in which:

FIGS. 2A through 11A and FIGS. 2B through 11B, respectively, are perspective views and cross-sectional views at intermediate stages of manufacturing a FinFET device, in accordance with various embodiments.

DETAILED DESCRIPTION

The making and using of the embodiments of the disclosure are discussed in detail below. It should be appreciated, however, that the embodiments can be embodied in a wide variety of specific contexts. The specific embodiments discussed are merely illustrative, and do not limit the scope of the disclosure.

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description may include embodiments in which the first and second features are formed in direct or indirect contact.

Some variations of the embodiments are described. Throughout the various views and illustrative embodiments, like reference numbers are used to designate like elements. It is understood that additional steps can be provided before, during, and after the method, and some of the steps described can be replaced or eliminated for other embodiments of the method.

Embodiments of mechanisms for forming a semiconductor device are provided. It is also noted that the present disclosure presents embodiments in the form of multi-gate transistors or fin-type multi-gate transistors referred as to herein as FinFET devices. The FinFET device may be a dual-gate device, tri-gate device and/or other configurations. FinFET devices may be included in an IC such as a microprocessor, memory device, and/or other ICs.

Figure 1:
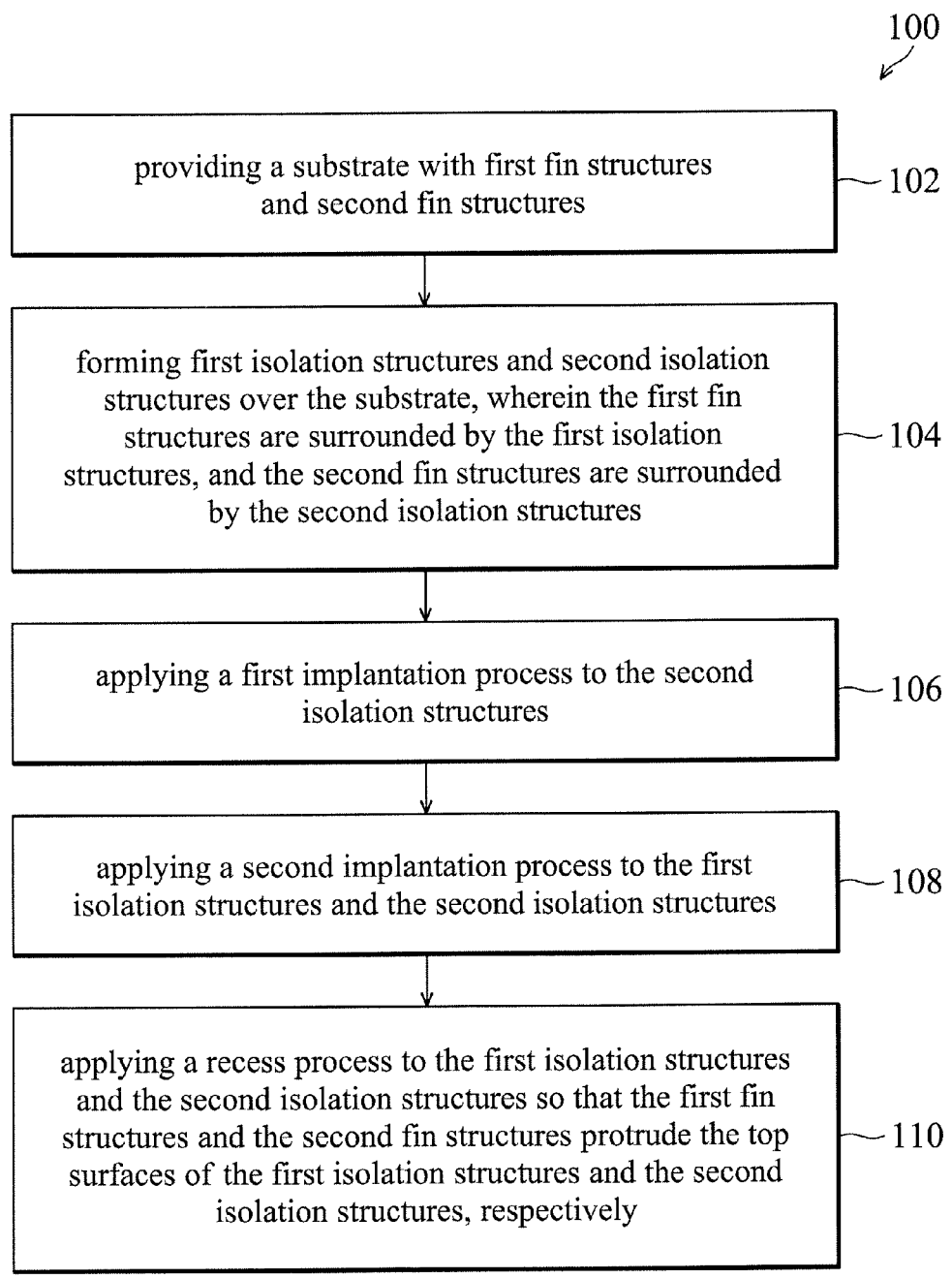
FIG. 1 is a flowchart illustrating a method for forming a FinFET device, in accordance with some embodiments.

FIG. 1 is a flowchart illustrating a method 100 for forming a semiconductor device, in accordance with some embodiments. The method 100 starts at operation 102, in which a substrate with first fin structures and second fin structures is provided. The method 100 continues to operation 104, in which first isolation structures and second isolation structures are formed over the substrate. The first fin structures are partially surrounded by the first isolation structures, and the second fin structures are partially surrounded by the second isolation structures. The method 100 continues to operation 106, in which a first implantation process is applied to the second isolation structures. The method 100 continues to operation 108, in which a second implantation process is applied to the first isolation structures and the second isolation structures. The method 100 continues to operation 110, a recess forming process is applied to the first isolation structures and the second isolation structures so that the first fin structures and the second fin structures protrude through the top surfaces of the first isolation structures and the second isolation structures, respectively.

It is noted that the method of FIG. 1 does not produce a completed FinFET device. A completed FinFET device may be fabricated using complementary metal-oxide semiconductor (CMOS) technology processing. Accordingly, additional processes may be provided before, during, and after the method 100 of FIG. 1, and some other processes may only be briefly described herein. Also, FIGS. 1 through 11B are simplified for a better understanding of the concepts of the present disclosure.

FIGS. 2A through 10A and FIGS. 2B through 10B, respectively, are perspective views and cross-sectional views at intermediate stages of manufacturing a FinFET device 200, in accordance with some embodiments. In FIGS. 2A through 10B, figures ending with a "B" designation are taken along a cross section line a-a shown in figures ending with an "A" designation. In addition, FIG. 11B is taken along a cross section line b-b shown in FIG. 11A.

Figure 2A:
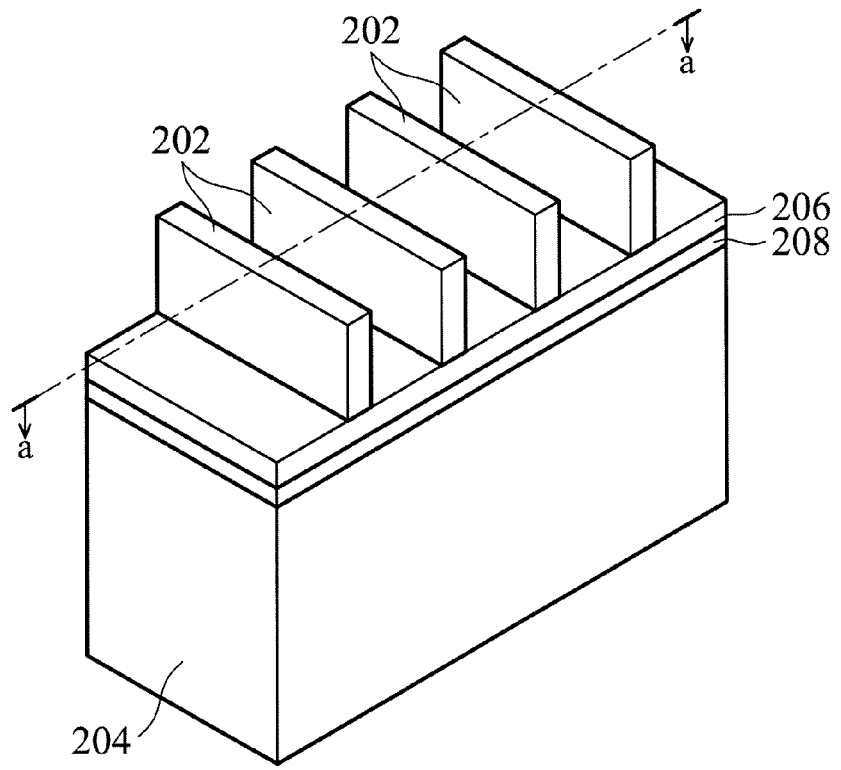
Figure 2B:
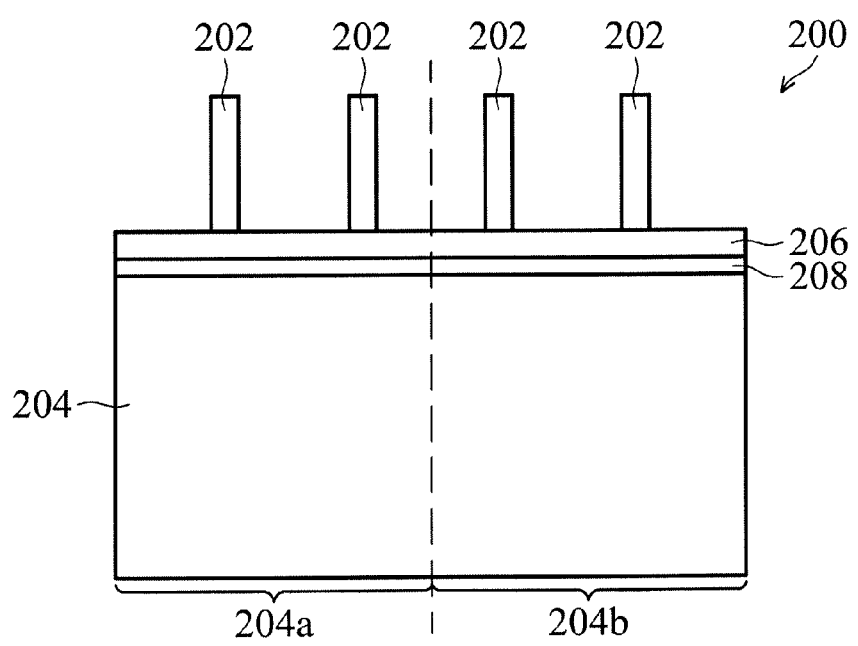

In the intermediate stage of manufacture illustrated in FIGS. 2A and 2B, a patterned photo-sensitive layer 202, such as a photoresist or the like, is formed on a substrate 204. The patterned photo-sensitive layer 202 is formed atop a hard mask 206, which in turn is at the top of a pad oxide 208, which in turn is atop the substrate 204. The hard mask 206 may be silicon nitride, silicon oxynitride, or the like. The pad oxide 208 may be silicon oxide or the like.

The substrate 204 may be a bulk substrate such as a bulk silicon wafer. Alternatively, the substrate 204 may simply be a top semiconductor layer of a compound wafer, such as silicon-on-insulator substrate. In yet other embodiments, the substrate 204 may be either a bulk substrate or a top layer of a compound wafer. The compound wafer may comprise Ge, SiGe, SiC, a III-V material such as GaAs, InAs, GaP, InP or InSb, a II-VI material such as ZeSe or ZnS, or the like. It is believed that the III-V or II-VI material may be particularly advantageous for forming illustrated devices because of the beneficial strain properties that can be derived from using the III-V or II-VI material. The substrate 204 may have a first region 204a and a second region 204b, where FinFETs of a standard threshold voltage will be formed in the first region 204a, and FinFETs of a low threshold voltage will be formed in the second region in the subsequent processes.

Figure 3A:
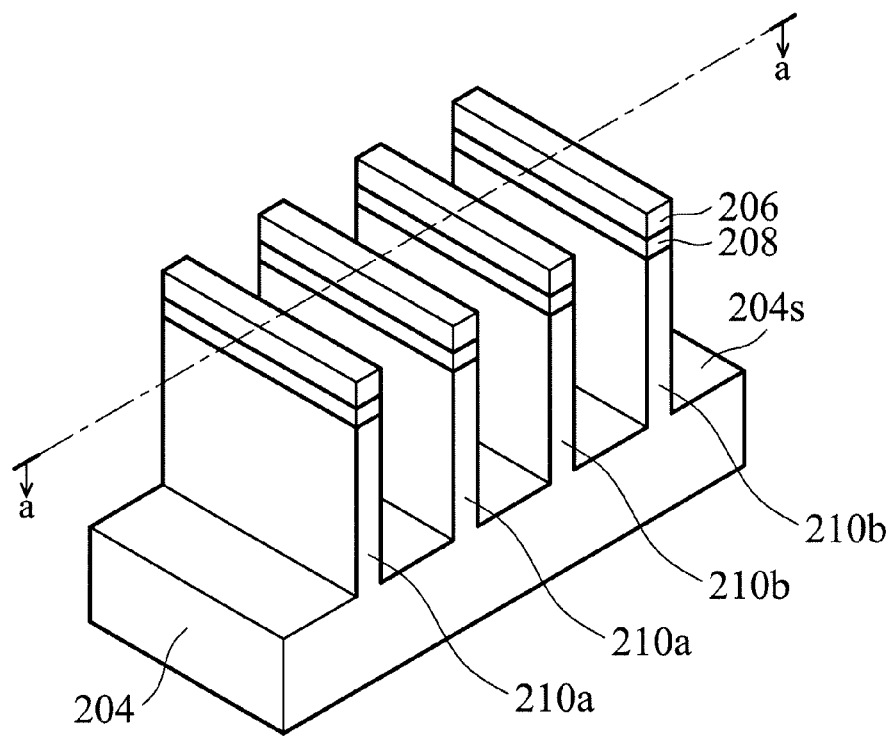
Figure 3B:
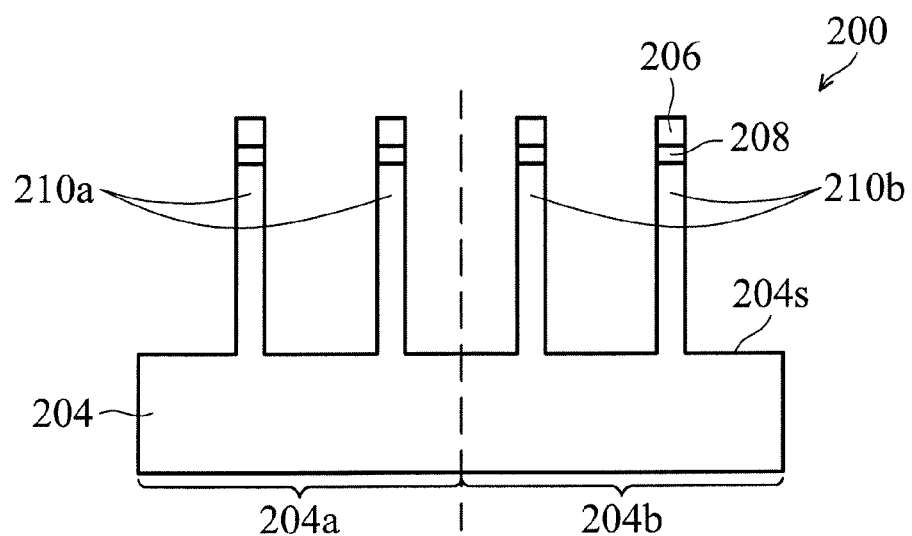

As illustrated in FIGS. 3A and 3B (wherein FIG. 3A continues the perspective view and FIG. 3B continues the cross-sectional view of FIGS. 2A and 2B, respectively), the pattern of the patterned photo-sensitive layer 202 is transferred into the hard mask 206, the pad oxide 208, and the substrate 204 using any suitable etching processes. During this pattern transfer process, the patterned photo-sensitive layer 202 may be entirely consumed as indicated by FIGS. 3A and 3B. In some embodiments, the patterned photo-sensitive layer 202 is not entirely consumed, but rather remaining portions of the patterned photo-sensitive layer 202 are removed, e.g., by an oxygen plasma or so-called ash process.

The resulting structure includes some fin structures formed in the substrate 204. For example, first fin structures 210a are formed in the first region 204a, and second fin structures 210b are formed in the second region. In some embodiments, each fin of the fin structures 210a and 210b has a sidewall, a portion of the sidewall being substantially orthogonal to a major surface 204s of the substrate 204. In some embodiments, a lower portion of the sidewall is non-orthogonal to the major surface 204s of the substrate 204. In some embodiments, the substrate 204 is etched to a depth D, meaning from the top surface of the fin structures 210a and 210b to the major surface 204s of the substrate 204, from about 40 nm to about 80 nm. It should be noted that, while the figures through the description shows the FinFET device 200 includes only four fins, this is merely an example. There may be many modifications, alternatives and variations. For example, the FinFET device 200 may accommodate any number of fins depending on different applications and needs.

Figure 4A:
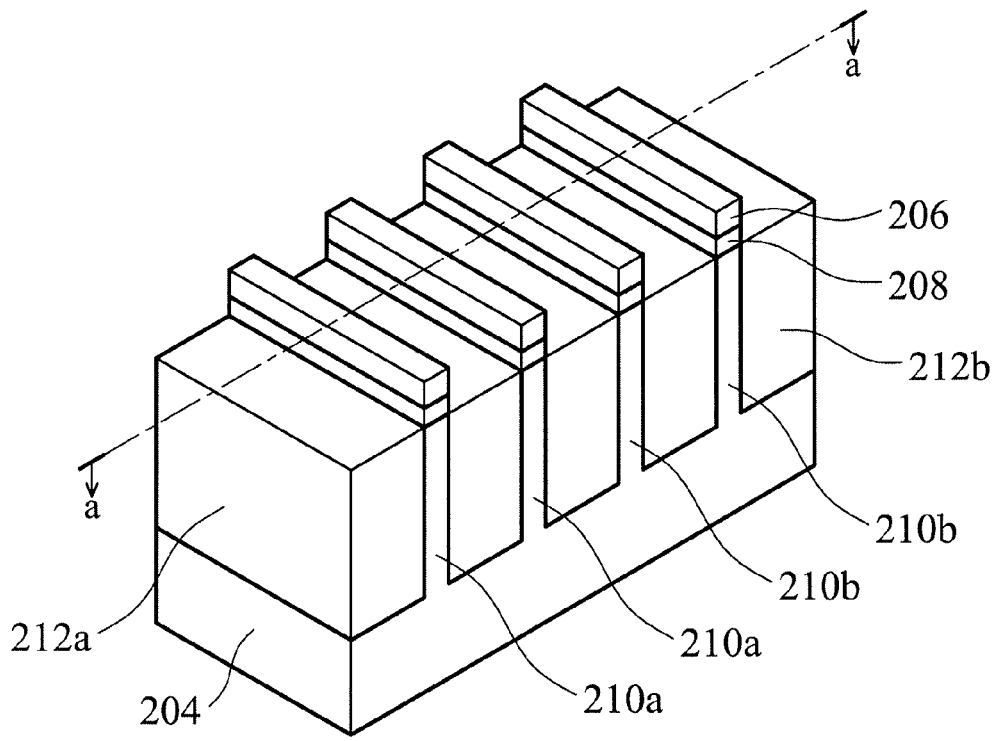
Figure 4B:
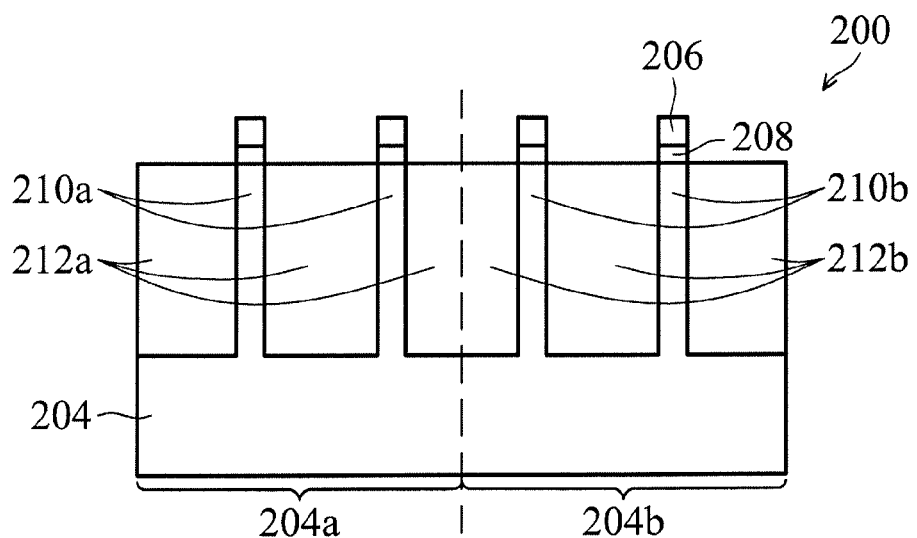

FIGS. 4A and 4B illustrate the following stage in the manufacturing process, isolation structures are deposited in and on the substrate 204, in accordance with some embodiments. For example, the isolation structures may include first isolation structures 212a in the first region 204a and the second isolation structures 212b in the second region 204b. In some embodiments, each of the first and second isolation structures 212a and 212b has a top surface that is lower than the top of the hard mask 206. In some embodiments, the first and second isolation structures 212a and 212b are referred to as shallow trench isolation (STI). The first and second isolation structures 212a and 212b may be made of a dielectric material such as silicon oxide, high-density plasma (HDP) oxide, silicon nitride, silicon oxynitride, fluoride-doped silicate glass, a low-k dielectric material, and/or other suitable insulating material. The first and second isolation structures 212a and 212b may be deposited through suitable deposition techniques such as CVD, sub-atmospheric CVD, high density plasma CVD (HDPCVD), spin-on glass and/or the like. Optionally and prior to forming the isolation structures 212a and 212b, thermal oxidation of the fin structures 210a and 210b may be undertaken to repair any damage to the sidewalls that occurred during the etching step (illustrated in FIGS. 3A and 3B). In some embodiments, a chemical mechanical polishing (CMP) process is applied to thin the first and second isolation structures 212a and 212b back to the level of the top of the hard mask 206, and a selective etching process is applied to further thin the first and second isolation structures 212a and 212b back to a point that is lower than the top of the hard mask 206.

Figure 5A:
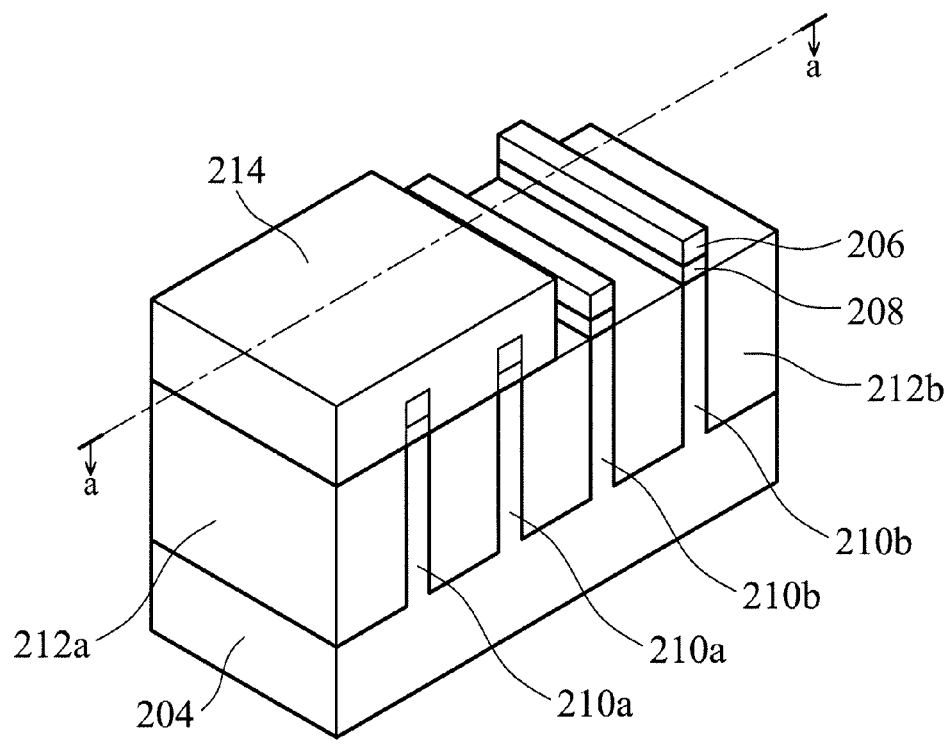
Figure 5B:
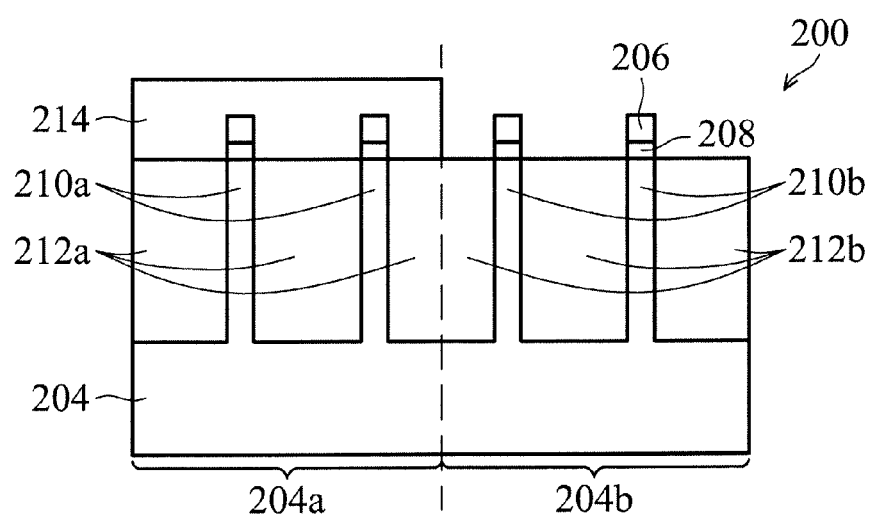

Afterwards, as illustrated in FIGS. 5A and 5B, a patterned mask layer 214, such as a photoresist, is formed over the first region 204a of the substrate 204, in accordance with some embodiments. In some embodiments, the mask layer 214 at least covers the first fin structures 210a. In some embodiments, the mask layer 214 covers the first isolation structures 212a and the first fin structures 210a. The second isolation structures 212b are still exposed. The patterned mask layer 214 may be formed of suitable photoresist material such as polybenzoxazole (PBO), SU-8-photo-senbstive epoxy, film type polymer materials and/or the like.

Figure 6A:
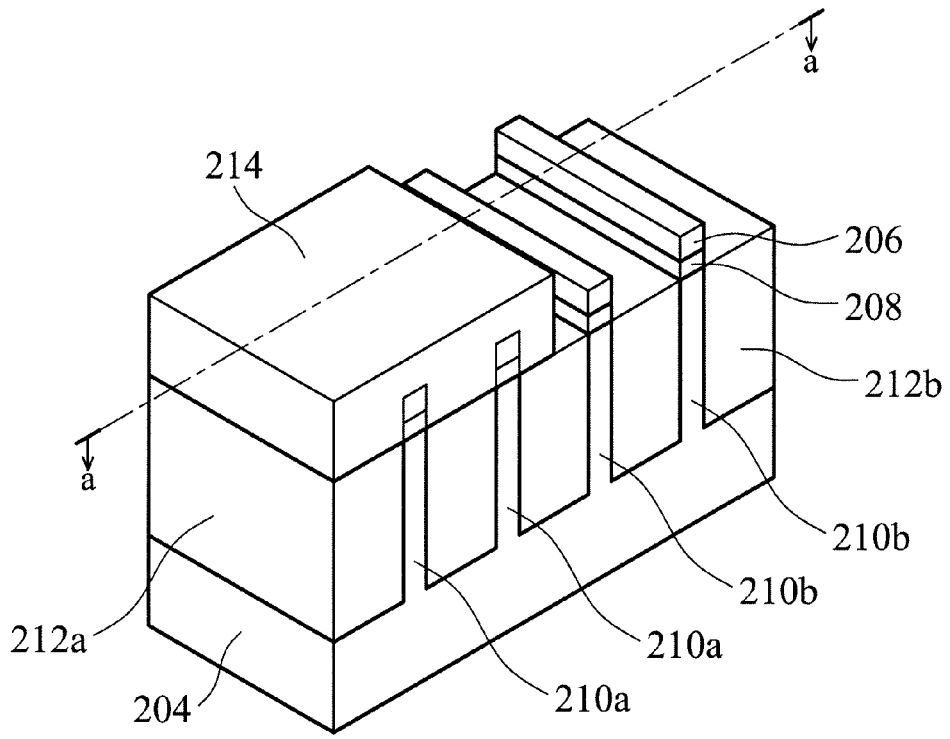
Figure 6B:
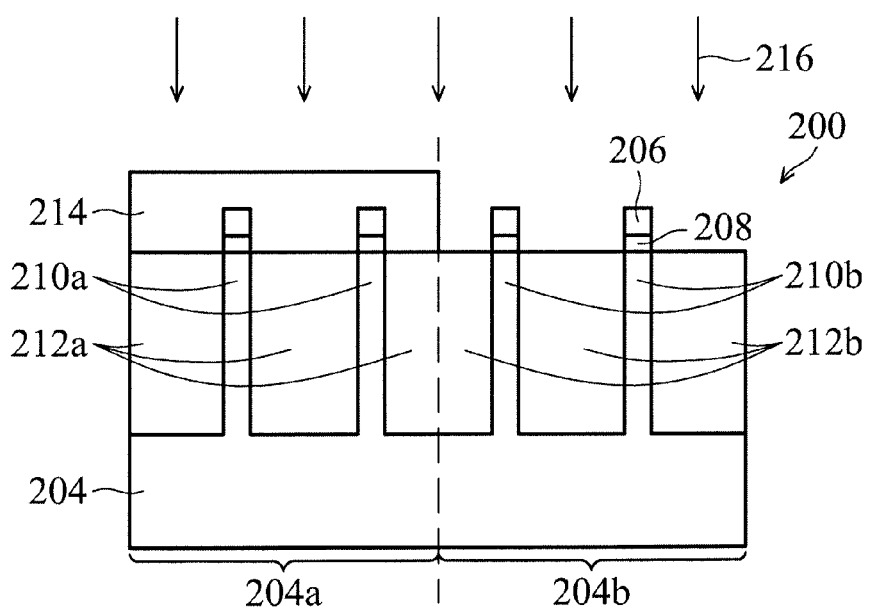

Afterwards, as illustrated in FIGS. 6A and 6B, a first implantation process 216 is applied to the second isolation structures 212b, in accordance with some embodiments. The first implantation process 216 may include performing one or more implantations for doping a first dopant into the second isolation structures 212b. In some embodiments, the first implantation process 216 includes performing the implantation only once. In some embodiments, the first implantation process 216 includes performing the implantations only twice with different dopants. Alternatively, the first implantation process 216 includes performing three or more implantations with different dopants. The first dopant may include one or more dopants, such as As, P, B, $BF_2$, Ar, Sb, Ge, Se, N, C, H, or a combination thereof. During the first implantation process 216, the first isolation structures 212a are protected by the patterned mask layer 214, and the first and the second fin structures 210a and 210b are protected by the hard mask 206. The dosage of the first implantation process 216 may be in a range from about 2E13 $cm^{-2}$ to about 1E14 $cm^{-2}$. The first implantation process 116 may be performed at an energy level ranging from about 3 kV to about 10 kV. In some embodiments, the patterned mask layer 214 is removed by suitable techniques such as an ash process after the first implantation process 216.

Figure 7A:
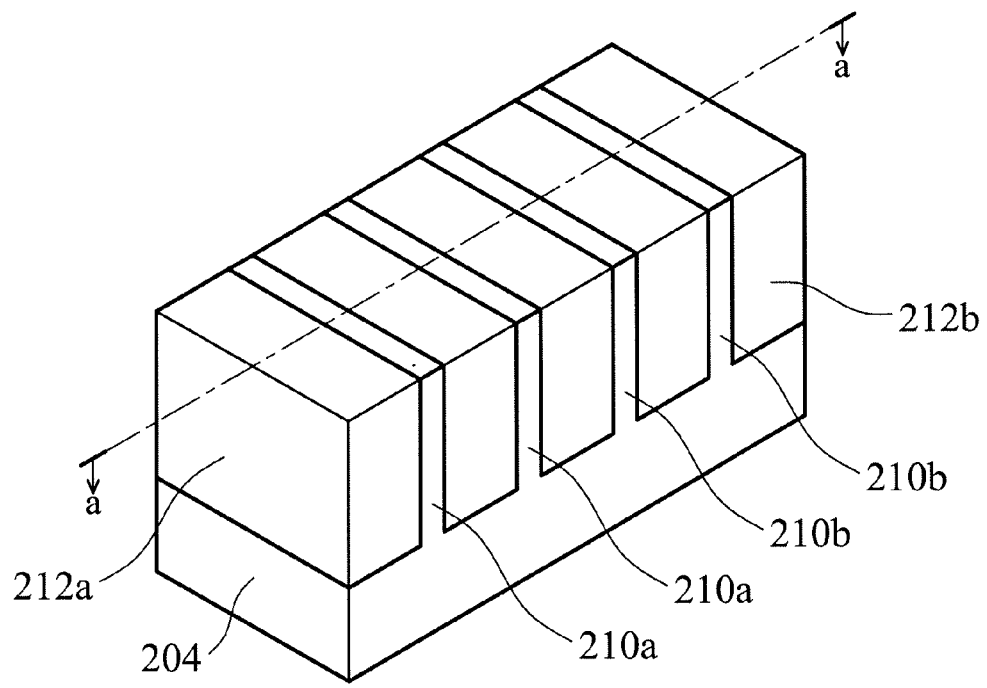
Figure 7B:
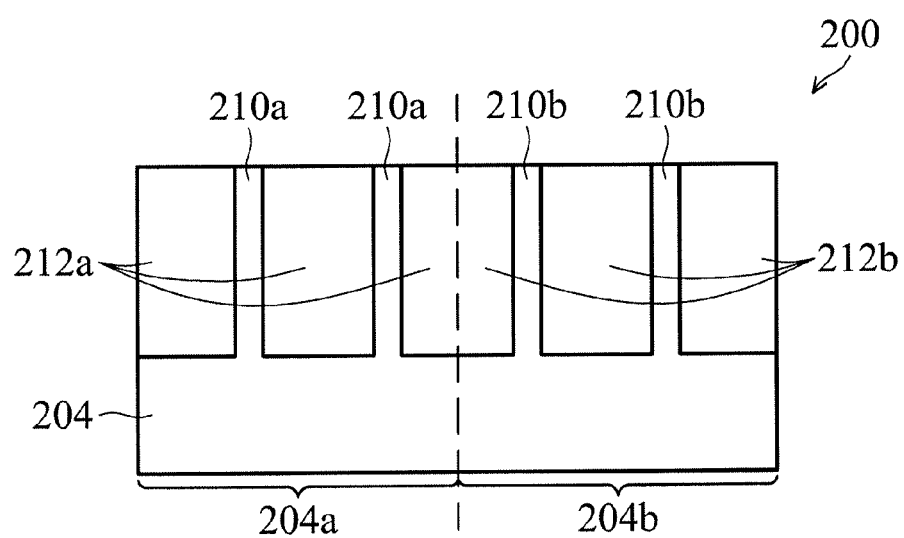

Afterwards, referring to FIGS. 7A and 7B, the hard mask 206 and the pad oxide 208 are removed, in accordance with some embodiments. The hard mask 206 and the pad oxide 208 are removed by a suitable etching process and a CMP process. The CMP process may be performed until the first and second fin structures 210a and 210b are exposed.

Figure 8A:
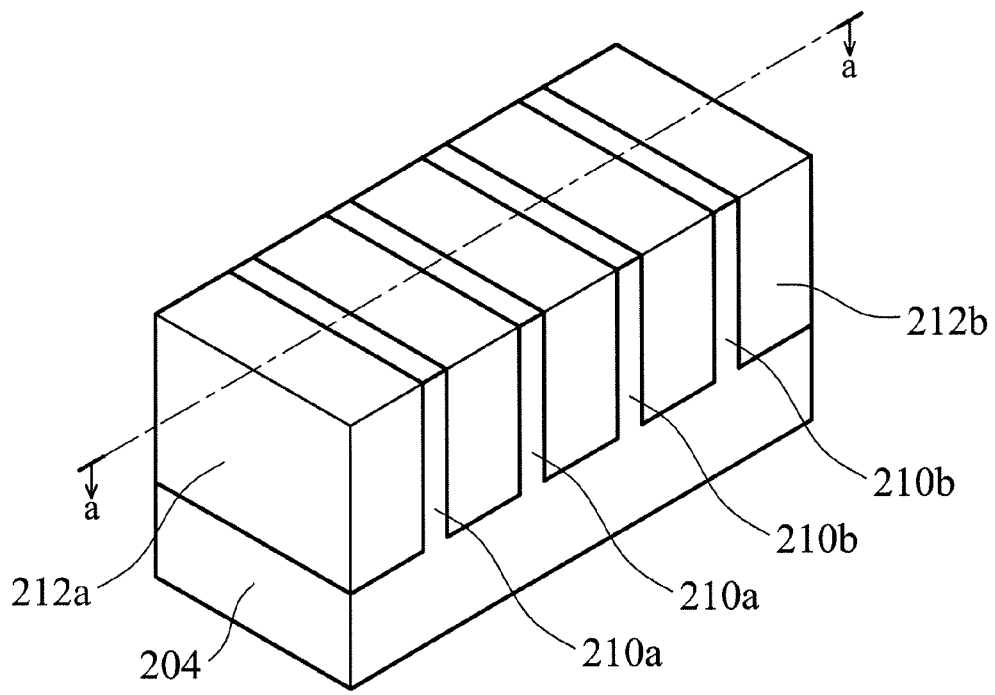
Figure 8B:
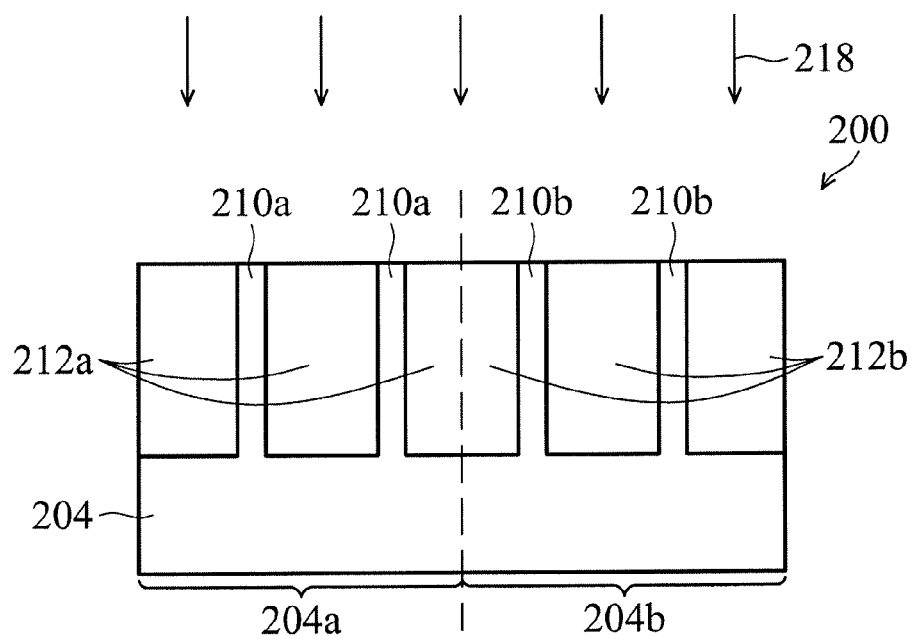

Afterwards, referring to FIGS. 8A and 8B, a second implantation process 218 is applied to both the first region 204a and the second region 204b, in accordance with some embodiments. The second implantation process 218 may include doping a second dopant into both the first and second isolation structures 212a and 212b and the fin structures 210a and 210b. The second dopant may include a p-type dopant, such as B, $BF_2$, Ge, and/or the like when the FinFET device 200 needs P-wells (not shown) in the fin structures 210a and 210b. Alternatively, the second dopant may include an n-type impurity, such P, As, N, and/or the like when the FinFET device 200 needs N-wells in the fin structures 210a and 210b. The second dopant may vary depending on different design needs and applications. In some embodiments, the second dopant is the same as or different from the first dopant. The dosage of the second implantation process 218 may be in a range from 2E13 cm$^{-2}$ to about 1E14 cm$^{-2}$. In some embodiments, the second implantation process 218 is performed at an energy level ranging from about 3 kV to about 10 kV. The second implantation process 218 may include performing one or more implantations for doping the second dopant into the first and second isolation structures 212a and 212b. In some embodiments, the second implantation process 218 includes performing the implantation only once. In some embodiments, the second implantation process 218 includes performing the implantation only twice with different dopants. In some embodiments, the second implantation process 218 includes performing three or more implantations with different dopants.

In the resulting structure, the first isolation structures 212a are implanted by only the second implantation process 218, and the second isolation structures 212a are implanted by both first and second implantation processes 216 and 218. The second isolation structures 212b have a higher dopant concentration that that of the first isolation structures 212a. In some embodiments, the second isolation structures 212b include the first dopant that is not included in the isolation structures 212a. The etching rates of the first and second isolation structures 212a and 212b are therefore different. In some embodiments, the etching rate of the second isolation structures 212b is higher than that of the first isolation structures 212a due to the presence of the first dopant. Such etching rate difference may help to achieve different fin heights during a single recess forming process.

Although the etching rate difference is achieved by implanting the second isolation structures 212b with the first dopant as described above, the etching rate difference also can be achieved by other ways. For example, the etching rate difference also can be achieved by implanting the first isolation structures 212a with other dopants that can decrease the etching rate in the first implantation process 216, in accordance with embodiments.

After the implantation process as shown in FIGS. 8A and 8B, an annealing process may be performed to increase the implantation depth of the second dopant. The annealing process may be a rapid thermal annealing (RTA) process, a millisecond annealing process (MSA) process, a laser annealing process and/or the like. In some embodiments, the annealing temperature is in a range from about 600 degrees Celsius to about 1300 degrees Celsius.

Figure 9A:
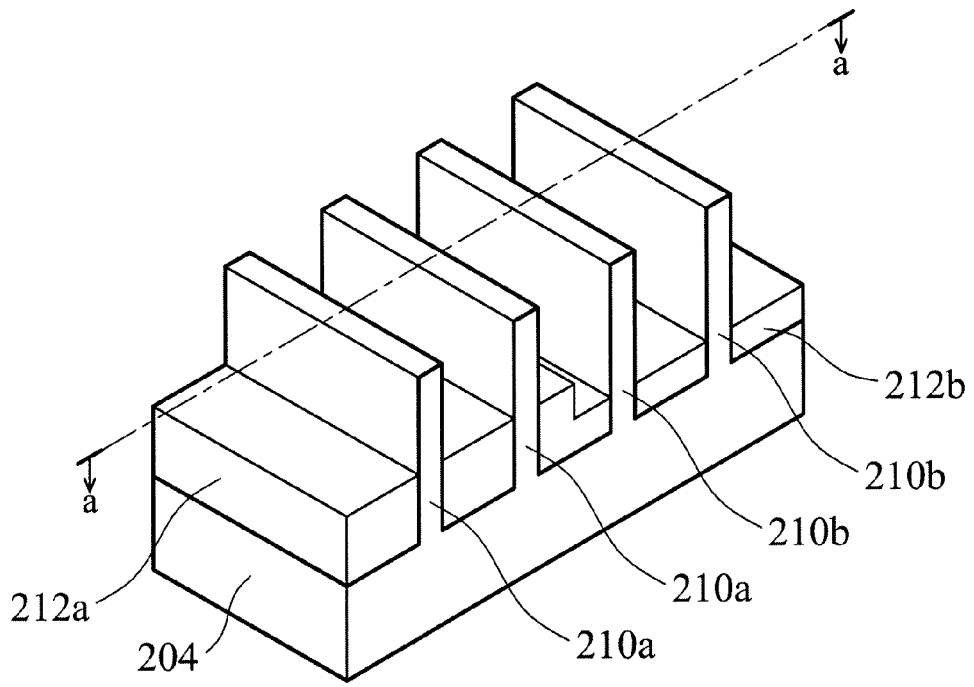
Figure 9B:
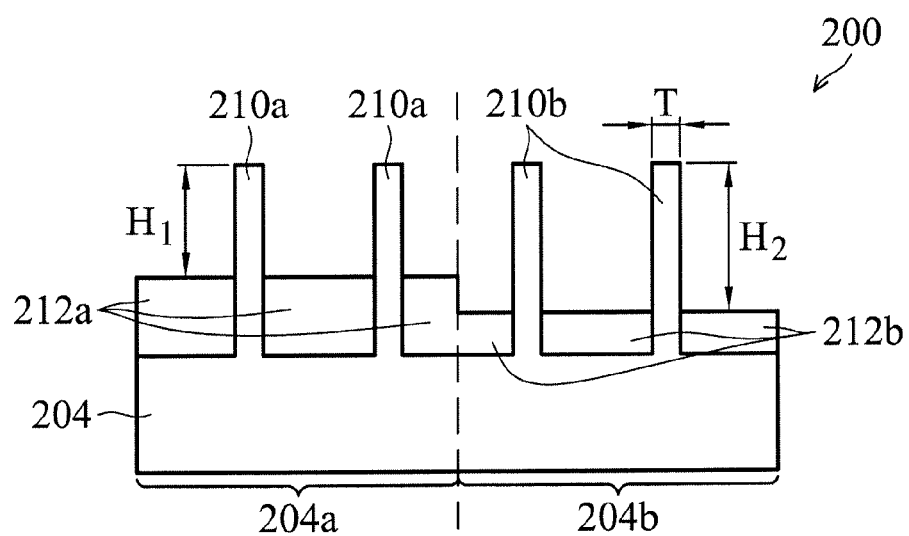

Afterwards, referring to FIGS. 9A and 9B, recess forming process is performed on the first and second isolation structures 212a and 212b for further thinning them back, in accordance with some embodiments. Accordingly, the first fin structures 210a in the first region 204a protrudes through the top surface of the first isolation structures 212a, and the second fin structures 210b in the second region 204b protrude through the top surface of the second isolation structures 212b. The first and second isolation structures 212a and 212b can be thinned back in a variety of ways. In some embodiments, the first and second isolation structures 212a and 212b are thinned back by a chemical oxide removal using a Tokyo Electron CERTAS, an Applied Material SICONI tool and/or the like. Alternatively, the first and second isolation structures 212a and 212b are thinned back by diluted hydrofluoric acid (DHF) treatment or a vapor hydrofluoric acid (VHF) treatment for a suitable time. In some embodiments, the diluted HF acid is a mixture of HF and water (1:100).

Note that the recess depths of the first and second isolation structures 212a and 212b are different due to the etching-rate difference, which results in the different heights of the protruding portions of the first fin structures 210a and the second fin structures 210b. As shown in FIGS. 9A and 9B, each of the first fin structures 210a has a fin height $H_1$, measured from the top surface of the first fin structures 210a to the top surface of the first isolation structures 212a, ranging from about 30 nm to about 50 nm, or approximately 36 nm. Each of the second fin structures 210b has a fin height $H_2$, measured from the top surface of the second fin structures 210b to the top surface of the second isolation structures 212b, ranging from about 35 nm to about 100 nm. In some embodiments, the difference between the fin height $H_1$ and the fin height $H_2$ is in a range from about 5 nm to about 50 nm.

The channel width, meaning two times the fin height plus a thickness T of the top surface of the fin structure, impacts device performance, such as threshold voltage and driving current of the resulting FinFETs. In other words, the threshold voltage and the driving current can be tuned by adjusting the fin heights. The resulting FinFETs including the second fin structures 210b may have a lower threshold voltage and a larger driving current, as compared to the FinFETs including the first fin structures 210b.

In addition, as described above, the fin height difference can be achieved through a single etching step, such as the recess forming process as shown in FIGS. 9A and 9B. Such a single etching step to achieve different fin heights helps to further reduce the cost of fabricating FinFET devices.

Figure 10A:
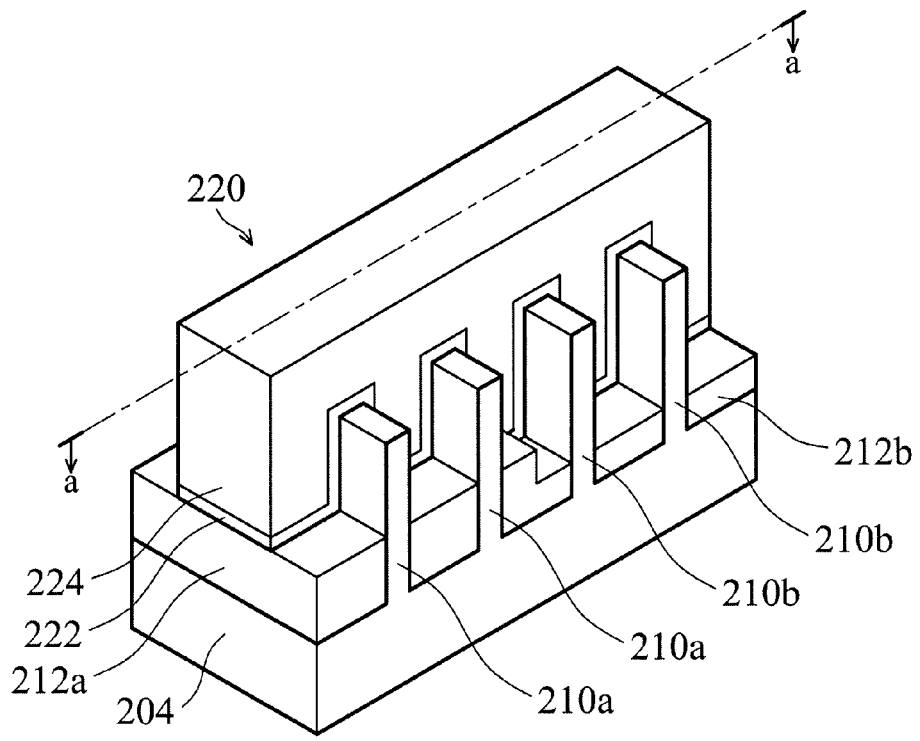
Figure 10B:
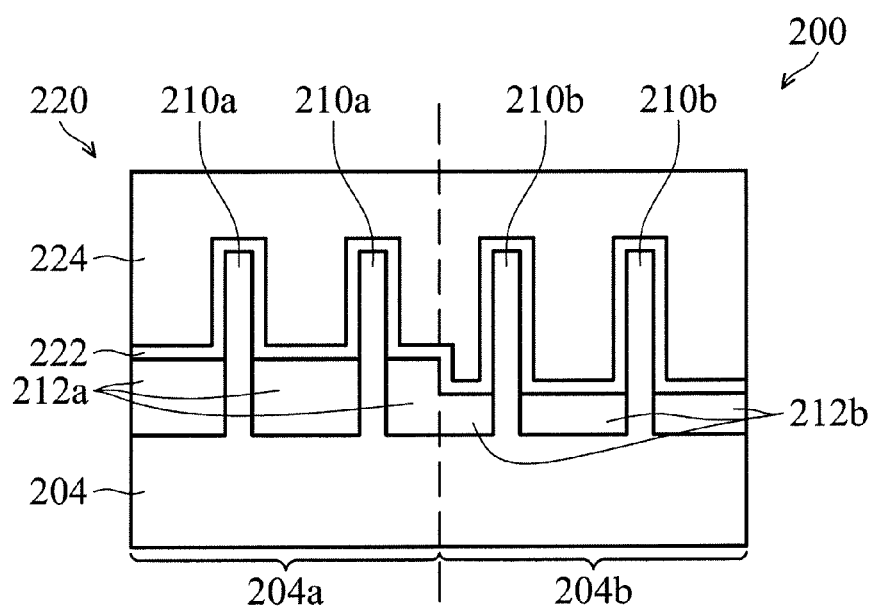

Afterwards, referring to FIGS. 10A and 10B, a gate structure 220 is formed over the first and second fin structures 210a and 210b, in accordance with some embodiments. The gate structure 220 may include a gate dielectric layer 222, a gate electrode layer 224, and/or one or more additional layers. In some embodiments, the gate structure 220 is a sacrificial gate structure such as that formed in a replacement gate process used to form a metal gate structure. In some embodiments, the gate structure 220 includes a polysilicon layer (such as the gate electrode layer 224).

The gate dielectric layer 222 may include silicon dioxide. The silicon dioxide may be formed by suitable oxidation and/or deposition methods. Alternatively, the gate dielectric layer 222 may include a high-k dielectric layer such as hafnium oxide (HfO$_2$). Alternatively, the high-k dielectric layer may optionally include other high-k dielectrics, such as LaO, AlO, ZrO, TiO, Ta$_2$O$_5$, Y$_2$O$_3$, SrTiO$_3$, BaTiO$_3$, BaZrO, HfZrO, HfLaO, HfTaO, HfSiO, HfSiON, HMO, LaSiO, AlSiO, (Ba, Sr)TiO$_3$, Al$_2$O$_3$, or other suitable high-k dielectric materials, combinations thereof, or other suitable material. The high-k dielectric layer may be formed by atomic layer deposition (ALD), CVD, metalorganic chemical vapor deposition (MOCVD), physical vapor deposition (PVD), plasma enhanced chemical vapor deposition (PECVD), plasma enhanced atomic layer deposition (PEALD), a combination thereof, and other suitable techniques.

Figure 11A:
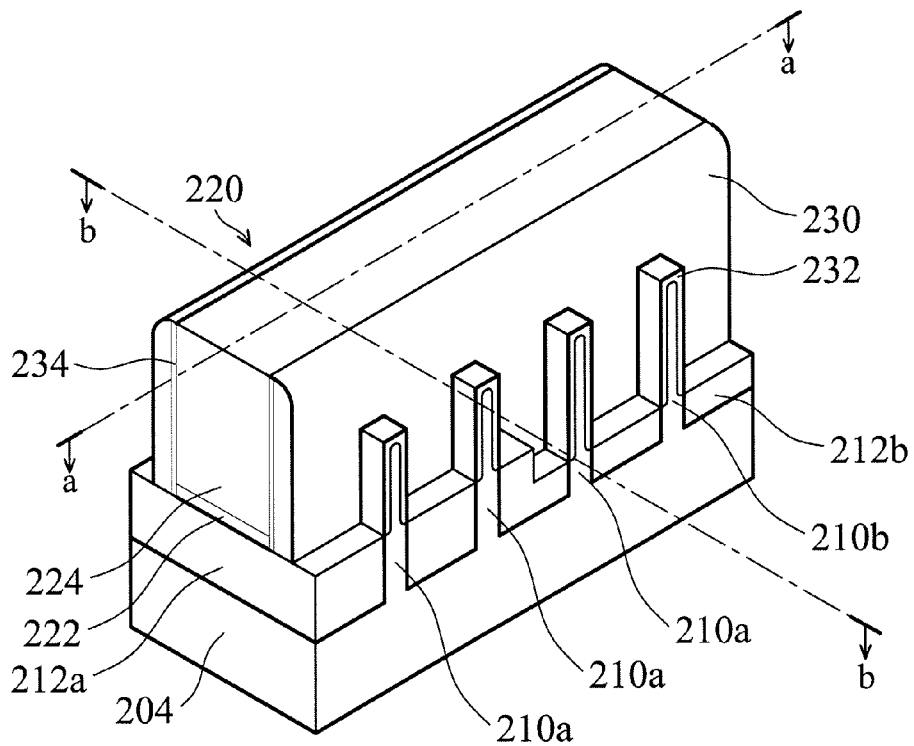
Figure 11B:
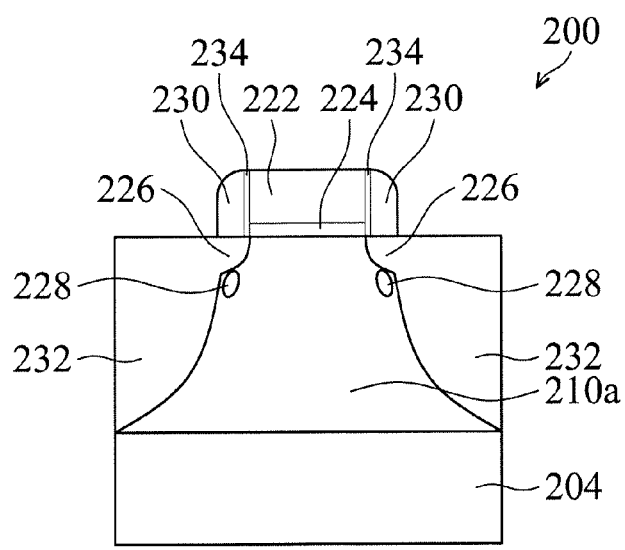

Afterwards, referring to FIGS. 11A and 11B, lightly doped drain/source (LDD/S) regions 226, pocket regions 228, gate spacers 230 and source/drains (S/D) regions 232 are formed, in accordance with some embodiments. In some embodiments, a sealing layer 234 is also formed. In some embodiments, the LDD/S regions 226 and the pocket regions 228 are formed by LDD implantation and pocket implantation, respectively. The LDD/S regions 226 are formed near the top surfaces of the fin structures 210a and 210b and near the gate electrode layer 224, and the pocket regions are deeper than the LDD/S regions 226. The LDD/S implantation and the pocket implantation may be tilted and be performed towards the sidewalls of the fin structures 210a and 210b. In some embodiments, the LDD/S implantation and the pocket implantation are doped by different type of dopants. The pocket regions can also help tune the threshold voltage and driving current.

The pocket implantation needs a greater tilt angle than the LDD/S implantation, but sometimes it is shadowed by the fin heights or a total height of fin structures and a photoresist (if the photoresist is needed). In some embodiments, the pocket regions are not formed since the threshold voltage and the driving current can already be tuned by the variation of fin heights.

In some embodiments, the sealing layer 234, the gate spacers 230 and heavily doped regions 232 are formed after the formation of the LDD/S regions 226. In some embodiments, the sealing layer 234 covers the sidewalls of the gate electrode layer 224 and the LDD/S regions 226. In some embodiments, the gate spacers 230 cover the sealing layer 234. Afterwards, the heavily doped regions 232 are formed by performing a heavier and deeper implantation, than the LDD/S implantation, to the fin structures 210a and 210b while using the gate spacers 230 as a mask.

Figure 12:
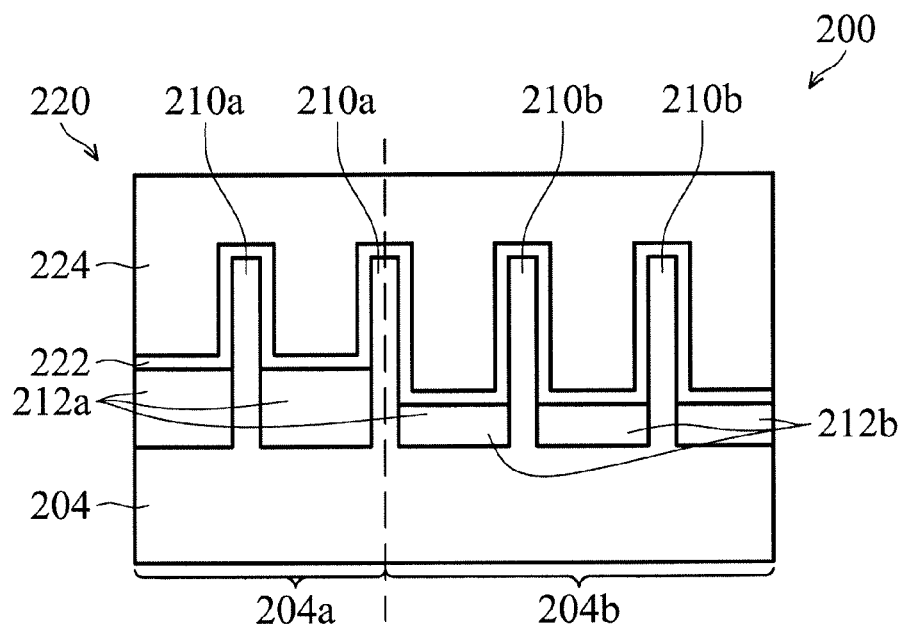
FIGS. 12 and 13 are cross-sectional views at intermediate stages of manufacturing a FinFET device, in accordance with some embodiments.
Figure 13:
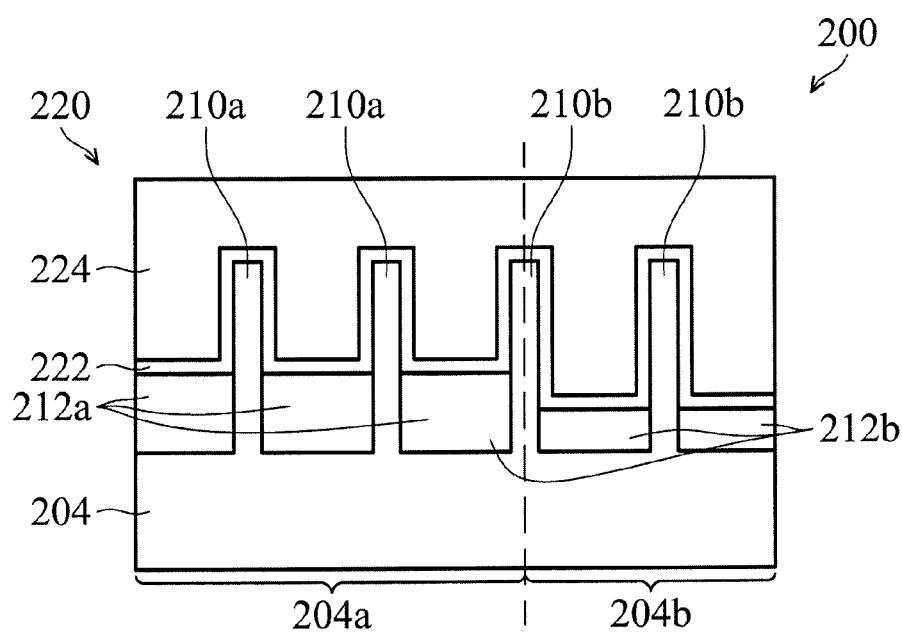

In FIGS. 11A and 11B, the dividing boundary between the first region 204a and 204b is between the fin structures 210a and the fin structures 210b, however, it is merely an example. For example, FIGS. 12 and 13 illustrate cross-sectional views of the intermediate stages of manufacturing FinFET device 200, respectively, in accordance with some embodiments. In FIG. 12, the dividing boundary between the first region 204a and second region 204b is aligned with or to the fin structure 210a, and the first isolation structures 212a and the second isolation structures 212b are divided by the fin structure 210a. In FIG. 13, the dividing boundary between the first region 204a and second region 204b is aligned with or to the fin structure 210, and the first isolation structures 212a and the second isolation structures 212b are divided by the fin structure 210b. In some embodiments, the dividing boundary between the first region 204a and second region 204b is aligned with or to a side wall or side surface of the fin structure 210a or 210b.

Embodiments of mechanisms for forming a FinFET device are provided. Isolation structures can have different etching rates by tuning dopant concentrations and/or kinds of dopants. Different fin heights can therefore be achieved by a single recess forming process. FinFETs in each specific region can have a desired threshold voltage and driving current by tuning the fin heights. Device performance is improved.

In some embodiments, a semiconductor device is provided. The semiconductor device includes a first fin partially surrounded by a first isolation structure and a second fin partially surrounded by a second isolation structure. The second isolation structure has a dopant concentration higher than that of the first isolation structure, and a height difference is between a top surface of the first isolation structure and a top surface of the second isolation structure.

In some embodiments, a semiconductor device is provided. The semiconductor device includes a first isolation structure formed over a substrate and a second isolation structure formed over the substrate. The semiconductor device also includes a first fin extended above the first isolation structure, and the first fin has a first fin height measured from a top surface of the first fin to a top surface of the first isolation structure. The semiconductor device further includes a second fin extended above the second isolation structure, and the second fin has a second fin height measured from a top surface of the second fin to a top surface of the second isolation structure. The second fin height is greater than the first fin height, and wherein the second isolation structure has a dopant concentration higher than that of the first isolation structure In some embodiments, a semiconductor device is provided. The semiconductor device includes a first isolation structure formed over a substrate and a second isolation structure formed over the substrate. The semiconductor device also includes a first fin extended above the first isolation structure, and the first fin has a first bottom portion embedded in the first isolation structure, and the first bottom portion has a first depth. The semiconductor device also includes a second fin extended above the second isolation structure, and the second fin has a second bottom portion embedded in the second isolation structure. The second bottom portion has a second depth smaller than the first depth.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device, comprising:
   a first fin partially surrounded by a first doped isolation structure doped with a second dopant, wherein the first doped isolation structure is in direct contact with a portion of a sidewall surface of the first fin; and
   a second fin partially surrounded by a second doped isolation structure doped with a first dopant and the second dopant, wherein the second doped isolation structure is in direct contact with a portion of a sidewall surface of the second fin, and the second doped isolation structure has a dopant concentration higher than that of the first doped isolation structure, and a height difference is between a top surface of the first doped isolation structure and a top surface of the second doped isolation structure.

2. The semiconductor device as claimed in claim 1, further comprising:
   a gate dielectric layer formed over the first doped isolation structure and the second doped isolation structure, wherein the gate dielectric layer has a first portion on the first fin and a second portion on the second fin, and a bottom surface of the second portion of the gate dielectric layer is lower than a bottom surface of the first portion of the gate dielectric layer.

3. The semiconductor device as claimed in claim 2, further comprising:
a gate electrode layer formed on the gate dielectric layer, wherein the gate electrode layer has a first portion on the first fin and a second portion on the second fin, and a bottom surface of the second portion of the gate electrode layer is lower than the top surface of the first doped isolation structure.

4. The semiconductor device structure as claimed in claim 1, wherein the first dopant comprises As, P, B, $BF_2$, Ar, Sb, Ge, Se, N, C, H, or a combination thereof.

5. The semiconductor device as claimed in claim 1, wherein the first fin has a first fin height measured from a top surface of the first fin to a top surface of the first doped isolation structure; and the second fin has a second fin height measured from a top surface of the second fin to a top surface of the second doped isolation structure, and the second fin height is greater than the first fin height.

6. The semiconductor device as claimed in claim 1, wherein the first fin and the second fin both are doped fins which are doped with the second dopant.

7. A semiconductor device structure, comprising:
a first doped isolation structure formed over a substrate;
a second doped isolation structure formed over the substrate;
a first fin extended above the first doped isolation structure, wherein the first fin has a first fin height measured from a top surface of the first fin to a top surface of the first doped isolation structure;
a second fin extended above the second doped isolation structure, wherein the second fin has a second fin height measured from a top surface of the second fin to a top surface of the second doped isolation structure, and the second fin height is greater than the first fin height, and wherein the second doped isolation structure has a dopant concentration higher than that of the first doped isolation structure; and
a third fin between the first fin and the second fin, wherein the third fin has a first sidewall surface and a second sidewall surface, the first doped isolation structure is in direct contact with the first sidewall surface and the second doped isolation structure is in direct contact with the second sidewall surface.

8. The semiconductor device as claimed in claim 7, further comprising:
a gate dielectric layer formed over the first doped isolation structure and the second doped isolation structure, wherein the gate dielectric layer has a first portion on the first fin and a second portion on the second fin, and a bottom surface of the second portion of the gate dielectric layer is lower than a bottom surface of the first portion of the gate dielectric layer.

9. The semiconductor device as claimed in claim 8, wherein the gate dielectric layer is formed on the third fin, a first portion of the gate dielectric layer is formed on the first sidewall surface of the third fin and a second portion of the gate dielectric layer is formed on the second sidewall surface of the third fin, and the first portion is higher than the second portion.

10. The semiconductor device as claimed in claim 8, further comprising:
a gate electrode layer formed on the gate dielectric layer, wherein the gate electrode layer has a first portion on the first fin and a second portion on the second fin, and a bottom surface of the second portion of the gate electrode layer is lower than the top surface of the first doped isolation structure.

11. The semiconductor device as claimed in claim 7, wherein the second doped isolation structure comprises at least one dopant that is not included in the first doped isolation structure.

12. The semiconductor device as claimed in claim 11, wherein the at least one dopant comprises As, P, B, $BF_2$, Ar, Sb, Ge, Se, N, C, H, or a combination thereof.

13. The semiconductor device as claimed in claim 7, wherein the first doped isolation structure comprises the same dopant as the second doped isolation structure.

14. The semiconductor device as claimed in claim 7, wherein the first and second doped isolation structures are made of a dielectric material comprising silicon oxide, high-density plasma (HDP) oxide, silicon nitride, silicon oxynitride, fluoride-doped silicate glass, a low-k dielectric material, and/or other suitable insulating material.

15. A semiconductor device structure, comprising:
a first doped isolation structure formed over a substrate;
a second doped isolation structure formed over the substrate;
a first fin extended above the first doped isolation structure, wherein the first fin has a first bottom portion embedded in the first doped isolation structure, and the first bottom portion has a first depth;
a second fin extended above the second doped isolation structure, wherein the second fin has a second bottom portion embedded in the second doped isolation structure, and the second bottom portion has a second depth smaller than the first depth; and
a third fin between the first fin and the second fin, wherein the third fin has a first sidewall surface and a second sidewall surface, the first doped isolation structure is in direct contact with the first sidewall surface, the second doped isolation structure is in direct contact with the second sidewall surface.

16. The semiconductor device structure as claimed in claim 15, wherein the second doped isolation structure has a dopant concentration higher than that of the first doped isolation structure.

17. The semiconductor device structure as claimed in claim 16, wherein the second doped isolation structure comprises at least one dopant that is not included in the first doped isolation structure.

18. The semiconductor device as claimed in claim 17, wherein the at least one dopant comprises As, P, B, $BF_2$, Ar, Sb, Ge, Se, N, C, H, or a combination thereof.

19. The semiconductor device as claimed in claim 15, further comprising:
a gate dielectric layer formed over the first doped isolation structure and the second doped isolation structure, wherein the gate dielectric layer has a first portion on the first fin and a second portion on the second fin, and a bottom surface of the second portion of the gate dielectric layer is lower than a bottom surface of the first portion of the gate dielectric layer.

20. The semiconductor device as claimed in claim 19, further comprising:
a gate electrode layer formed on the gate dielectric layer, wherein the gate electrode layer has a first portion on the first fin and a second portion on the second fin, and a bottom surface of the second portion of the gate electrode layer is lower than the top surface of the first doped isolation structure.

\* \* \* \* \*